(12) United States Patent
Kobayashi et al.

(10) Patent No.: US 6,407,925 B1
(45) Date of Patent: Jun. 18, 2002

(54) CASING FOR ELECTRONIC CONTROL DEVICES

(75) Inventors: Toshiki Kobayashi, Okazaki; Keiichi Kato, Toyohashi; Hideki Takasu, Nukata-gun; Toshio Fujimura, Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/662,921

(22) Filed: Sep. 15, 2000

(30) Foreign Application Priority Data

Sep. 17, 1999 (JP) .......................... 11-264154
Sep. 17, 1999 (JP) .......................... 11-264155

(51) Int. Cl.⁷ ............................... H05K 5/00
(52) U.S. Cl. .................. 361/752; 361/724; 361/753; 200/61.88
(58) Field of Search ................ 361/737, 752, 361/740, 753, 759, 824–826; 200/61.88, 61.91, 11.1

(56) References Cited

U.S. PATENT DOCUMENTS 4,798,964 A * 1/1989 Fujii et al. ............... 235/492
5,719,746 A * 2/1998 Ohbuchi et al. ........... 361/737
6,144,273 A * 11/2000 Satoh et al. ............... 355/207

FOREIGN PATENT DOCUMENTS

| JP | 63-188545 | | 8/1988 |
| JP | 11-243283 | * | 9/1999 |

* cited by examiner

Primary Examiner—Kamand Cuneo
Assistant Examiner—Tuan Dinh
(74) Attorney, Agent, or Firm—Law Offices of David G. Posz

(57) ABSTRACT

A casing for an electronic control device, by which a cover and a casing body are reliably sealed up while preventing the cover from warping or from being distorted, although the cover is made of a thin sheet material. The electronic control device casing comprises: a casing body having an opening in its upper face portion for casing a printed circuit board; a cover made of a sheet material for closing the opening of the casing body; a groove portion formed in the open edge portion of the casing body; a liquid sealing material fitted in the groove portion for sealing the open edge portion of the casing body and the flange portion of the cover; and a ridge portion having a generally U-shaped section and formed on the flange portion of the cover for being fitted in the groove portion of the casing body.

15 Claims, 10 Drawing Sheets

CASING FOR ELECTRONIC CONTROL DEVICES

CROSS REFERENCE TO RELATED APPLICATION

This application is based upon Japanese Patent Application Nos. Hei. 11-264154 filed on Sep. 17, 1999 and Hei. 11-264155 filed on Sep. 17, 1999, the contents of which are incorporated herein by reference.

BACKGROUND OF THE INVENTION

1. Field of the Invention

The present invention relates to electronic control devices to be disposed in the engine room of an automobile, and particularly to a casing for the electronic control device which is improved in its water-proofing structure.

2. Related Art

An ECU (Engine Control Unit) being developed is shown in FIGS. 13–18.

First of all, a casing 4 of an ECU 1 is constructed, as shown in FIG. 13, to include: a casing body 5 having a shape of a rectangular container; and a cover 8 for closing the opening 51 in the upper face portion of the casing body 5. A printed circuit board 2 is mounted in the casing body 5 by means of screws 21. Moreover, a connector 3 is mounted on the right-hand end portion of the printed circuit board 2. In the right-hand sidewall portion 55 of the casing body 5, there is formed a connector opening 56 which communicates with the opening 51 for fitting the connector 3.

At the open edge portion of the casing body 5, as also shown in FIG. 14, there is formed a flange portion 58 having an upper face, in which there is formed a groove portion 59 for fitting a liquid sealing material 9 therein. Here, the groove portion 59 is omitted from FIG. 13.

In this construction, the liquid sealing material 9 is applied to the casing body 5 and the connector 3, as hatched in FIG. 13. Moreover, the printed circuit board 2 is mounted in the casing body 5 by means of the screws, and the cover 8 is mounted in the opening 56 (or on its flange portion 58) of the casing body 5 by means of the screws. Then, the flange portion 82 of the cover 8 and the flange portion 58 of the casing body 5 are sealed up by the liquid sealing material 9, as shown in FIG. 14. Although not shown, moreover, the upper face portion of the connector 3 and the flange portion 82 of the cover 8, the lower face portion of the connector 3 and the bottom face portion of the connector opening 56, and the two outer side portions 33 and 34 of the connector 3 and the two inner side portions 62 and 63 of the connector opening 56 are likewise sealed up by the liquid sealing material 9. Thus, the casing 4 is constructed to have a sufficient water-proofing performance.

In this construction of the prior art, the cover 8 is die-cast of aluminum to have a considerable thickness. Therefore, the construction has a problem that the cover 8 has a high production cost and a large weight. In order to solve this problem, we have conceived a construction in which the cover 8 is formed by pressing a thin steel sheet, for example.

However, the cover 8 of the thin steel sheet is made thin and short of a rigidity (or strength) in its entirety and is troubled by the warpage or distortion as a whole. If the cover 8 thus warps or is distorted, moreover, its flange portion 82 is deteriorated in its flatness, as shown in FIG. 15, so that the liquid sealing material 9 applied to the flange portion 58 of the casing body 5 partially fails to contact with the flange portion 82 of the cover 8 thereby to cause a defect that their sealing is incomplete.

In the case of an assembly in normal positions, more specifically, clearances of individually proper distances are formed between the two outer side portions 33 and 34 of the connector 3 and the two inner side portions 62 and 63 of the connector opening 56, as shown in FIG. 16. If the liquid sealing material 9 is fitted in these proper clearances, moreover, the sufficient sealing performance can be achieved.

When the connector 3 is so assembled as is located at a position displaced transversely from the normal position in the connector opening 56, on the contrary, one clearance is considerably reduced, as shown in FIG. 17. With a small clearance, if any, the liquid sealing material 9 does exist in the clearance so that the sealing performance can be retained. As shown in FIG. 17, however, the small clearance causes a trouble that the overflow of the liquid sealing material 9 increases.

When the assembly is made such that the connector 3 is more displaced transversely from the normal position in the connector opening 56, on the other hand, one side portion 34 (or 33) of the connector 3 comes into contact with (or into abutment against) one inner side portion 63 (or 62) of the connector opening 56, as shown in FIG. 18. In this case, the liquid sealing material 9 is scraped off to raise a problem the sealing performance is lost.

SUMMARY OF THE INVENTION

This invention has been conceived in view of the background thus far described and its first object is to provide a casing for an electronic control device which can prevent the cover from warping or from being distorted thereby to seal up the cover and the casing body reliably, although the cover is made of a thin sheet.

A second object of the invention is to provide a casing for an electronic control device, which can retain a clearance reliably between the two side portions of a connector and the two inner side portions of a connector opening thereby to retain a sufficient sealing performance, even with a low accuracy in the connector assembling position.

According to a first aspect of the invention, the opening of the upper face portion of the casing body for housing the electronic circuit unit is closed by the cover made of a thin sheet, and the groove portion formed in the open edge portion of the casing body is charged with the liquid sealing material for sealing the open edge portion of the casing body and the peripheral edge portion of the cover. Moreover, the ridge portion having a generally U-shaped section is so formed on the peripheral edge portion of the cover as to be fitted in the groove portion of the casing body. According to this construction, the ridge portion having the generally U-shaped section is formed on the peripheral edge portion of the cover so that the cover can be prevented from warping or from being distorted although it is made of the thin sheet. As a result, the cover and the casing body can be reliably sealed up. On the other hand, the ridge portion of the peripheral edge portion of the cover contacts with the liquid sealing material so that the length of contact with the liquid sealing material, i.e., the sealing length can be enlarged to enhance the sealing performance. Moreover, the amount of the liquid sealing material to fill up can be reduced by an amount corresponding to the sectional area of the ridge portion of the peripheral edge portion of the cover.

According to a second aspect of the invention, the electronic circuit unit is made of the printed circuit board, and the connector opening is so formed in the sidewall portion of the casing body as to communicate with the opening and to fit the connector at one end portion of the printed circuit board. Moreover, there is formed in the upper face portion of the connector the groove portion to be charged with the liquid sealing material. According to this construction, the printed circuit board can be assembled from the upper side in the casing body to improve the assembling workability. While making this upside assembly possible, moreover, it is possible to seal up the cover and the casing body, the cover and the connector, and the connector and the casing body reliably.

According to a third aspect of the invention, when the cover for closing the opening of the casing body is not made of a thin sheet, the wall portion is formed to rise from the open edge portion of the casing body on the outer side of the groove portion. According to this construction, the liquid sealing material can be prevented from overflowing by the wall portion when it is caused by the dispersion of its charge to overflow to the outside from between the open edge portion of the casing body and the peripheral edge portion of the cover.

According to a fourth aspect of the invention, the connector can be positioned by the positioning portion which is disposed on the two inner side portions of the connector opening or on the two outer side portions of the connector, thereby to retain a predetermined clearance between the inner side portions of the connector opening and the outer side portions of the connector. Even with a low accuracy of the assembled position of the connector, therefore, the clearance can be reliably retained between the two side portions of the connector and the two inner side portions of the connector opening of the casing body. As a result, a sufficient sealing performance can be achieved by fitting the liquid sealing material in that clearance.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

First Embodiment

Figure 1:
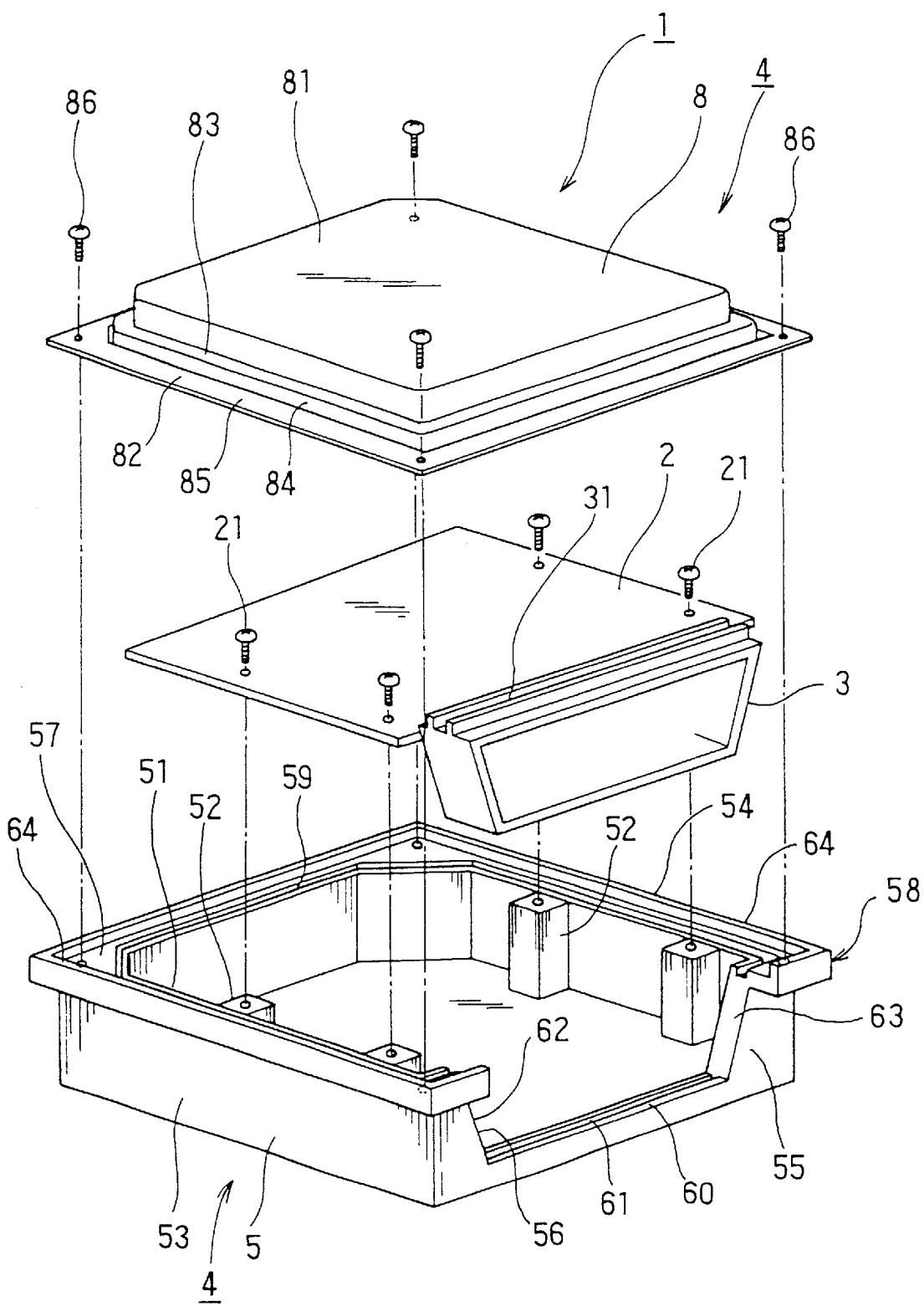
FIG. 1 is an exploded perspective view showing a first embodiment of the invention.
Figure 2:
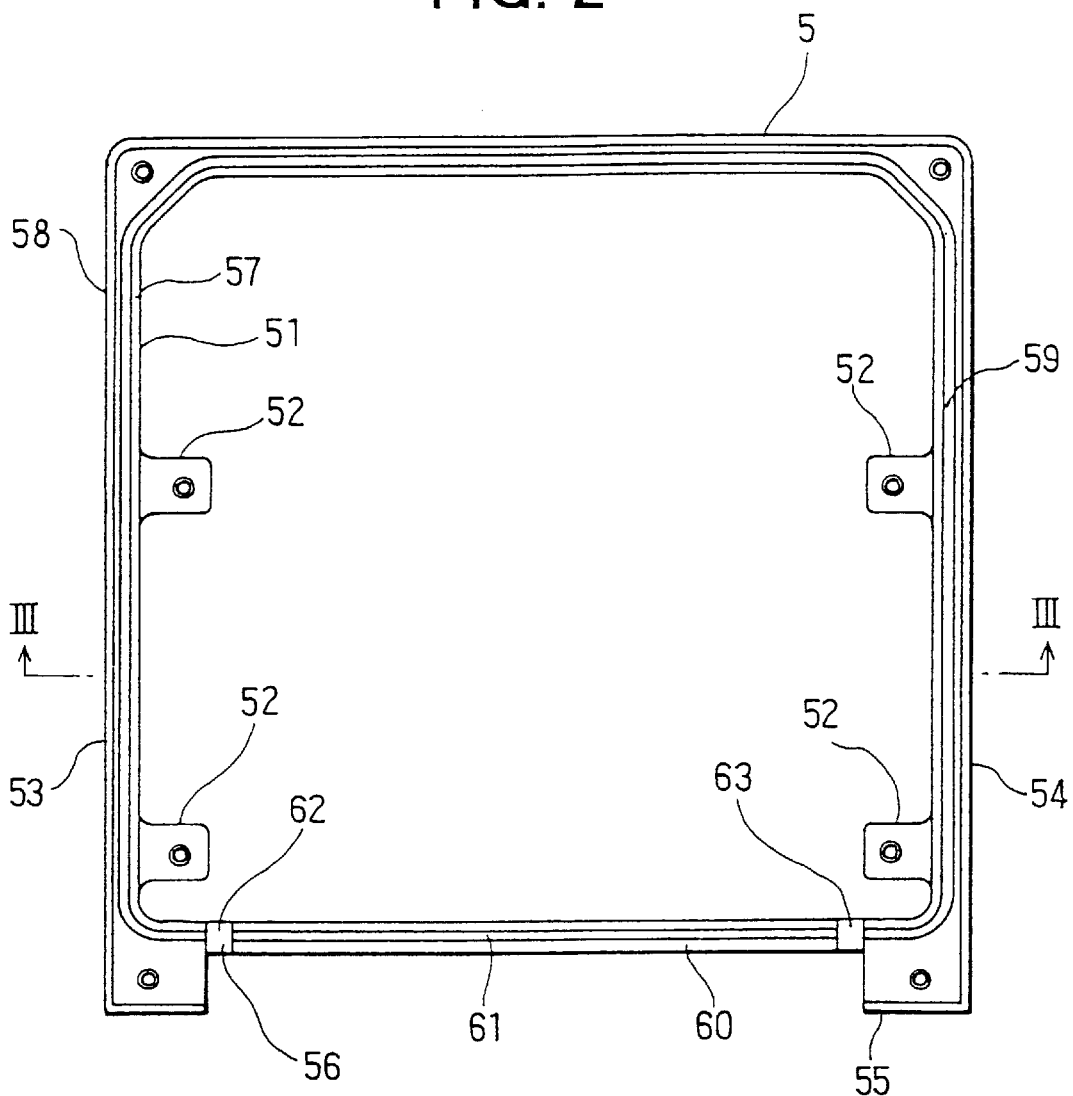
FIG. 2 is a top plan view of a casing body.
Figure 3:
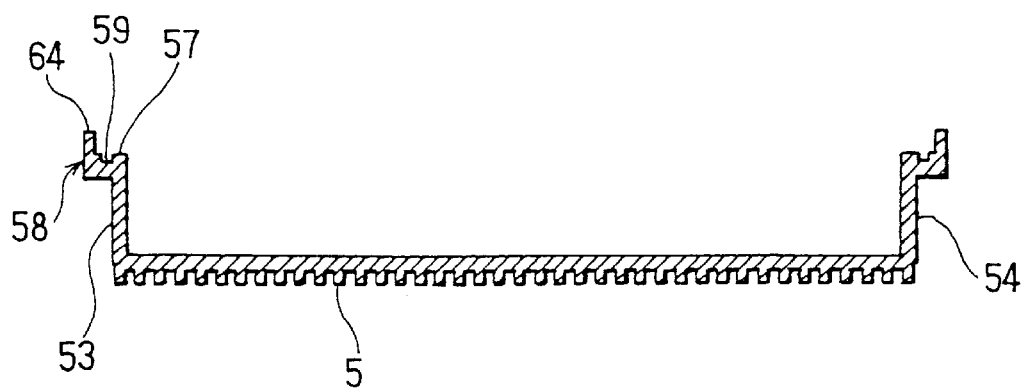
FIG. 3 is a longitudinal section taken along line III—III of FIG. 2.

A first embodiment, in which the invention is applied to an engine control unit (as will be called the "ECU"), will be described with reference to FIGS. 1 to 6. First of all, FIG. 1 is an exploded perspective view showing the entire construction of an ECU 1 of this embodiment schematically. As shown in FIG. 1, the ECU 1 is constructed to include: a printed circuit board 2 having various electronic parts including a microcomputer packaged therein and constructing the electronic circuit unit of the invention; a connector 3 soldered, for example, to the one end or right-hand end of the printed circuit board 2; and a casing 4 for casing the printed circuit board 2.

The casing 4 of the ECU 1 is constructed to include a square-shaped casing body 5 and a cover 8 for closing an upper face portion of the casing body 5. This casing body 5 is die-cast of aluminum, for example, to have relatively thick wall portions. In the casing body 5, there are formed a plurality of (e.g., four) support posts 52 which stand along the inner faces of left and right sidewall portions 53 and 54 of FIG. 2. These support posts 52 are the same size as that of the sidewall portions 53 and 54. In a sidewall portion 55 located on the lower side of the casing body 5 (FIG. 2), there is so formed (as shown in FIG. 1) a connector opening 56 having a generally trapezoidal shape for fitting the connector 3 substantially snugly as to communicate. with the opening 51.

In the case of this construction, the printed circuit board 2 is mounted in the casing body 5 by placing the printed circuit board 2 on the support posts 52 and by inserting and fitting the connector 3 of the printed circuit board 2 in the connector opening 56. The printed circuit board 2 is fixed by inserting screws 21 in screw holes formed in the printed circuit board 2 and by fastening the screws 21 in threaded holes formed in the support posts 52. Thus, the printed circuit board 2 is mounted in the casing body 5.

In this mounted state, moreover, the connector 3 and the casing body 5 are flush so that the upper face of the connector 3 and the open edge portion 57 of the casing body 5 are substantially at the same level.

Figure 4:
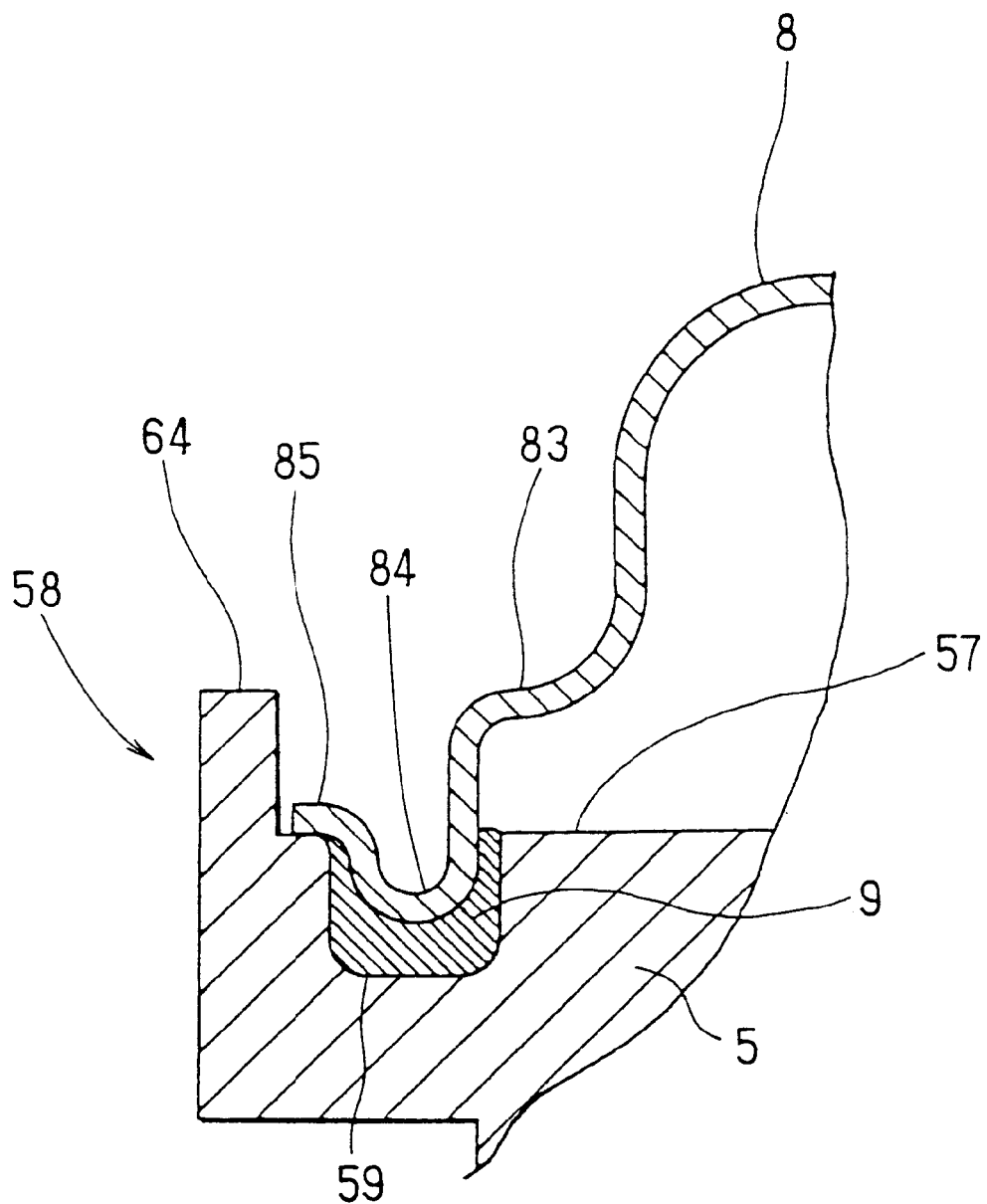
FIG. 4 is a partially enlarged longitudinal section of a portion at which a flange portion of a cover is mounted on a flange portion of the casing body.
Figure 6:
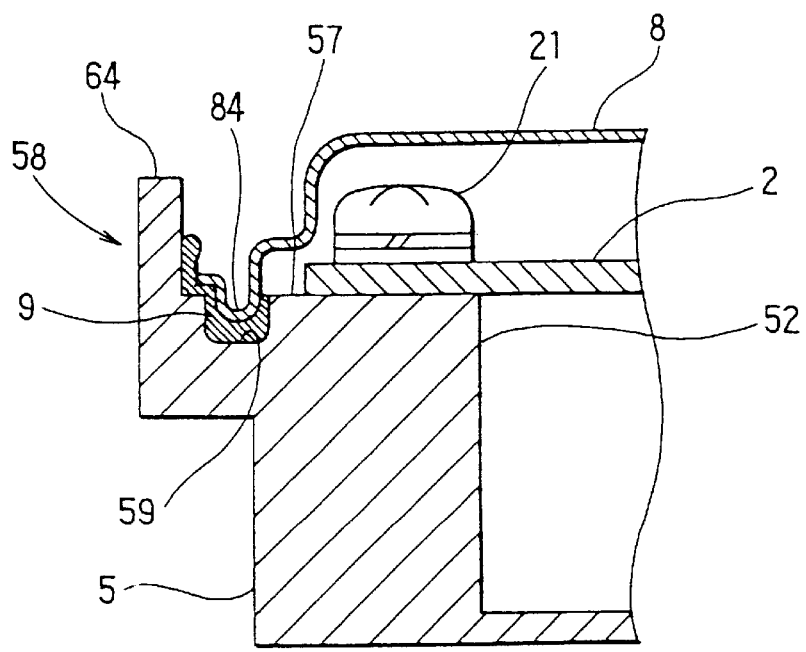
FIG. 6 is a longitudinal section of a portion at which the flange portion of the cover is mounted on the flange portion of the casing body.

From the open edge portion 57 of the casing body 5, on the other hand, a flange portion 58 protrudes in an outward direction. In the upper face of this flange portion 58 (or the open edge portion 57), there is formed a groove portion 59 which is filled with a liquid sealing material 9 (as shown in FIGS. 4 and 6). This liquid sealing material 9 is preferably exemplified by an adhesive resin having a sealing property, such as an ultraviolet curing resin, an activator curing resin, an anaerobic curing resin or a moisture curing resin.

In the upper face of the connector, there is also formed (as also referred to FIG. 5) a groove portion 31 to be charged with the liquid sealing material 9. This groove portion 31 of the connector 3 is substantially joined to the groove portion 59 of the casing body 5. Here, the groove portion 31 of the connector 3 is made wider than the. groove portion 59 of the casing body 5. However, the widths of those two groove portions 31 and 59 may be set to the same size.

Figure 5:
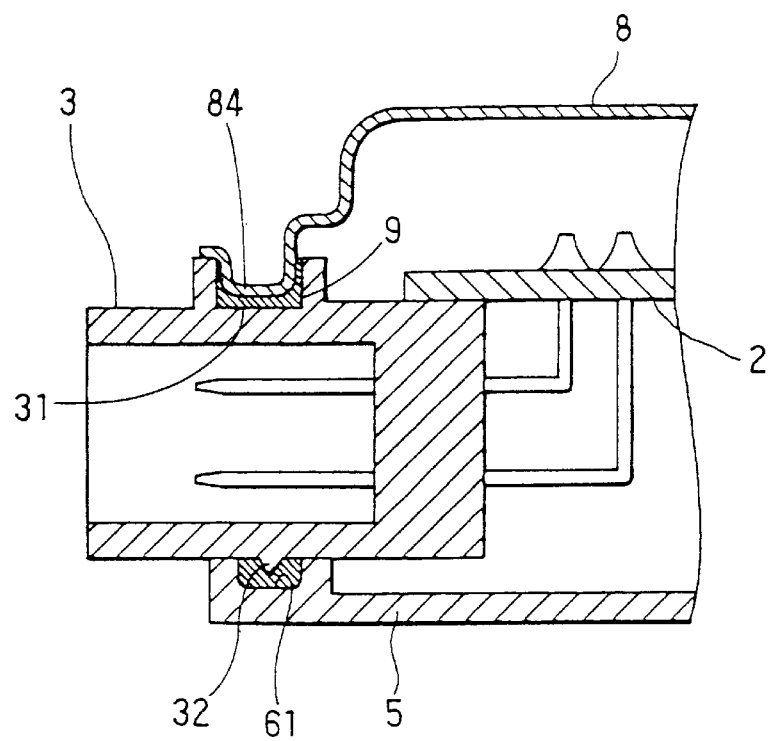
FIG. 5 is a longitudinal section of a connector portion of an ECU.

In a bottom portion 60 of the connector opening 56 of the casing body 5, moreover, there is formed (as also referred to FIG. 5) a groove portion 61 to be charged with the liquid sealing material 9. On the lower face of the connector 3, as shown in FIG. 5, there is formed a projection 32 to be fitted in the groove portion 61. Here, inner side face portions 62 and 63 on the two sides of the connector opening 56 are flattened to have no groove portion.

In addition, a wall portion 64 is formed (as referred to FIGS. 4 and 6) to rise (generally vertically) from the flange portion 58 (or the open edge portion 57) of the casing body 5. The wall portion 64 has a function (although will be described later) to plug up the liquid sealing material, as might otherwise overflow.

From the upper end portions of the left and right sidewall portions 53 and 54 of the casing body 5, there are protruded (not-shown) mounting members which are used for fixing the ECU 1 (or its casing 4) on the predetermined portions in the engine room of an automobile, for example.

On the other hand, the cover 8 is formed by pressing a thin iron sheet, for example. From this cover 8, there is formed to bulge a bulging portion 81. All over the peripheral edge portion of the cover 8, there is formed a flange portion 82. This flange portion 82 is constructed, as shown in FIGS. 4 and 6, to include an inner horizontal portion 83, a ridge portion 84 having a generally U-shaped section, and an outer horizontal portion 85.

The lower end portion of the ridge portion 84 is formed and sized to be fitted in the groove portion 59 of the casing body 5. Here, the lower end portion of the ridge portion 84, as corresponding to the groove portion 31 of the connector 3, is formed and sized to be fitted in the groove portion 81 and is made wider than the remaining portion. The outer horizontal portion 85 is formed to extend horizontally to the outside of the ridge portion 84.

The cover 8 having the individual portions thus shaped is manufactured by executing a pressing (or drawing) process including four or five steps, for example. In this case, the cover 8 is provided at the flange portion 82 of its peripheral edge portion with the ridge portion 84 and the outer horizontal portion 85, so that it has a sufficiently high entire rigidity (or strength) although it is formed of a thin sheet material (or an iron sheet). As a result, the cover 8 is prevented from warping or from being distorted in its entirety.

Here will be described the works for mounting the cover 8 on the casing body 5. First of all, the liquid sealing material 9 is applied to fill the groove portion 59 of the open edge portion 57 (or its flange portion 58) of the casing body 5, the inner side face portions 62 and 63 on the two sides of the connector opening 56 of the casing body 5, and the groove portion 61 of the inner bottom face portion 60 of the connector opening 56 of the casing body 5. At the same time, the liquid sealing material 9 is also applied to fill the groove portion 31 of the upper face portion of the connector 3 of the printed circuit board 2, the left and right outer side face portions of the connector 3, and the projection 32 of the lower face portion of the connector 3.

Then, the printed circuit board 2 is mounted and fixed in the casing body 5 by means of the screws 21, as has been described hereinbefore. In this mounted state, the liquid sealing material 9 is sandwiched between the left and right outer side faces and the lower face portion of the connector and between the inner side face portions 62 and 63 and the bottom face portion 60 of the connector opening 56 of the casing body 5 thereby to seal up the sandwiching portions water-tight.

After this, the opening 51 in the upper face portion of the casing body 5 is closed by the cover 8. As shown in FIGS. 4, 5 and 6, more specifically, the ridge portion 84 on the peripheral edge portion of the cover 8 is fitted in the groove portion 59 of the open edge portion 57 of the casing body 5 and in the groove portion 31 of the upper face portion of the connector 3. As shown in FIG. 1, screws 86 are inserted into screw holes formed in the four corner portions of the cover 8 and are fastened in threaded holes formed in the four corner portions of the open edge portion 57 (or its flange portion 58) of the casing body 5. As a result, the cover 8 is mounted in the casing body 5.

In this mounted state, moreover, the liquid sealing material 9 is sandwiched between the ridge portion 84 of the flange portion 82 of the cover 8 and the groove portion 59 of the flange portion 58 (or the open edge portion 57) of the casing body 5 and between the ridge portion 84 of the flange portion 82 of the cover 8 and the groove portion 31 of the upper face portion of the connector 3 thereby to seal up the sandwiching portions water-tight. As a result, the casing 4 of the ECU 1 becomes a casing having a sufficient water-proofing performance.

According to this embodiment thus constructed, the cover 8 is provided at its flange portion 82 (or its peripheral edge portion) with the ridge portion 84 having the generally U-shaped section. As a result, the cover 8 can be enhanced in its entire rigidity although it is formed of a thin sheet material such as an iron sheet, so that it can be reliably prevented from warping or from being distorted. Thus, the cover 8 and the casing body 5 can be held at a substantially uniform clearance so that they can be reliably sealed up with the liquid sealing material 9.

In the embodiment thus far described, on the other hand, the ridge portion 84 of the flange portion 82 of the cover 8 is in contact with the liquid sealing material 9 so that the length of contact with the liquid sealing material 9, i.e., the sealing length can be elongated to enhance the sealing performance. In the embodiment, moreover, the charging amount of the liquid sealing material 9 can be reduced by an extent corresponding to the sectional area of the ridge portion 84 of the flange portion 82 of the cover 8.

In the embodiment, moreover, the cover 8 is made of a steel sheet so that not only its manufacture cost but also its weight can be reduced, as compared with the case in which the cover 8 is die-cast of aluminum. Still moreover, the cover 8 is formed by pressing it so that it can be manufactured simply and easily, as compared with the case in which it is die-cast of aluminum.

In the embodiment, moreover, the outer horizontal portion 85 is so formed on the flange portion 82 of the cover 8 as to extend outward of the ridge portion 84 so that the rigidity of the cover 8 can be further enhanced. This makes it possible to prevent the cover 8 more reliably from warping or from being distorted.

In the embodiment, on the other hand, the wall portion 64 is formed to rise on the outer side of the groove portion 59 in the flange portion 58 (or the open edge portion 57) of the casing body 5. When the liquid sealing material 19 may overflow to the outside from between the flange portion 56 of the casing body 5 and the flange portion 82 of the cover 8, as shown in FIG. 6, due to the dispersion of its charging (or applied) amount, therefore, the overflow of the liquid sealing material 9 can be plugged up with the wall portion 64. As a result, it is possible to prevent the liquid sealing material 9 from dropping on the outer face of the sidewall portion of the casing body 5 thereby to improve the appearance of the product.

In this case, moreover, the liquid sealing material 9 can be prevented not only from dropping out of the casing body 5 but also from sticking to the case 4 of another ECU 1 (or another product) which is placed adjacent to the casing body 5. As a result, it is possible to keep the appearance of the other product excellent.

In the embodiment, moreover, the worker can confirm the liquid sealing material 9, as plugged up by the wall portion 64, visually easily. Thus, it is possible to recognize the omission of the step of applying the liquid sealing material 9 easily and the amount of the applied liquid sealing material 9 schematically.

In the embodiment, still moreover, the liquid sealing material 9 having been plugged up by the wall portion 64 is turned back by the wall portion 64 so that it sticks to the upper side of the outer horizontal portion 85 of the flange portion 82 of the cover 8. As a result, the length of contact with the liquid sealing material 9, i.e., the sealing length can be elongated to enhance the sealing performance.

On the other hand, the embodiment is constructed by forming the connector opening 56 communicating with the opening 51 in the sidewall portion 55 of the casing body 5 and by inserting and fitting the connector 3 of the printed circuit board 2 downward in that connector opening 56. According to this construction, both the step of mounting the printed circuit board 2 in the casing body 5 and the step of mounting the cover 8 on the casing body 5 can be executed by the upside assembly so that the assembling works can be easily automated.

In this construction, moreover, the liquid sealing material 9 is sandwiched between the left and right outer side face portions and the lower face portion (or its projection 32) of the connector 3 and the inner side face portions 62 and 63 and the bottom portion 60 (or its groove portion 61) of the connector opening 56 of the casing body 5 so that the sandwiching portions are sealed up water-tight. Moreover, the liquid sealing material 9 is sandwiched between the groove portion of the upper face portion of the connector 3 and the ridge portion 84 of the flange portion 82 of the cover 8 and between the groove portion 59 of the flange portion 58 (or its open edge portion 57) of the casing body 5 and the ridge portion 84 of the flange portion 82 of the cover 8 so that the sandwiching portions are sealed up water-tight. As a result, the construction having the sufficient water-proofing performance can be realized even by assembling the printed circuit board 2 (and the connector 3) downward with the casing body 5.

In the embodiment, the cover 8 is formed of the iron sheet, to which the invention should not be limited. The cover 8 may be made of another metal sheet such as an aluminum sheet or a stainless steel sheet or may be molded of plastics (or resins).

In the embodiment, on the other hand, the wall portion 64 is formed to rise from the outer side of the groove portion 59 of the flange portion 58 of the casing body 5, but the wall portion 64 can be dispensed with. In this modification, the construction loses the effect to plug up the liquid sealing material 9 having overflowed, but retains the remaining effects like the embodiment.

In the embodiment, moreover, the outer horizontal portion 85 is so formed on the flange portion 82 of the cover 8 as to extend outward of the ridge portion 84. However, the outer horizontal portion 85 may be omitted while leaving only the ridge portion 84 having the U-shaped section. In this construction, too, the cover 8 can still retain a sufficient strength.

In the embodiment, moreover, the ridge 84 is formed on the flange portion 82 of the cover 8 but may be omitted. In this modification, the sheet material for forming the cover 8 has to be thickened or die-cast of aluminum so as to enhance the strength of the cover 8. However, the effect to plug up the liquid sealing material 9 having overflowed can still be retained by the wall portion 64 which is formed to rise from the outer side of the groove portion 59 of the flange portion 58 of the casing body 5.

On the other hand, the embodiment is constructed by forming the connector opening 56 communicating with the opening 51 in the sidewall portion 55 of the casing body 5 and by inserting and fitting the connector 3 of the printed circuit board 2 downward in that connector opening 56. However, this construction may be modified such that a connector inserting opening (or a closed through hole) having no communication with the opening 51 is formed in the sidewall portion 55 of the casing body 5 so that the connector may be inserted into the formed opening. In this modified construction, the outer peripheral portion of the connector and the inner peripheral portion of the opening in the sidewall portion of the casing body may be sealed up with an O-ring, for example. Moreover, this construction can also retain the same effects (of which the effect for the sealing performance is higher) as those of the embodiment.

In the embodiment, the invention is applied to the case 4 of the ECU 1, and its application should not be limited thereto but may be extended to the case of another electronic control device requiring the water-proofing performance.

Second Embodiment

Figure 7:
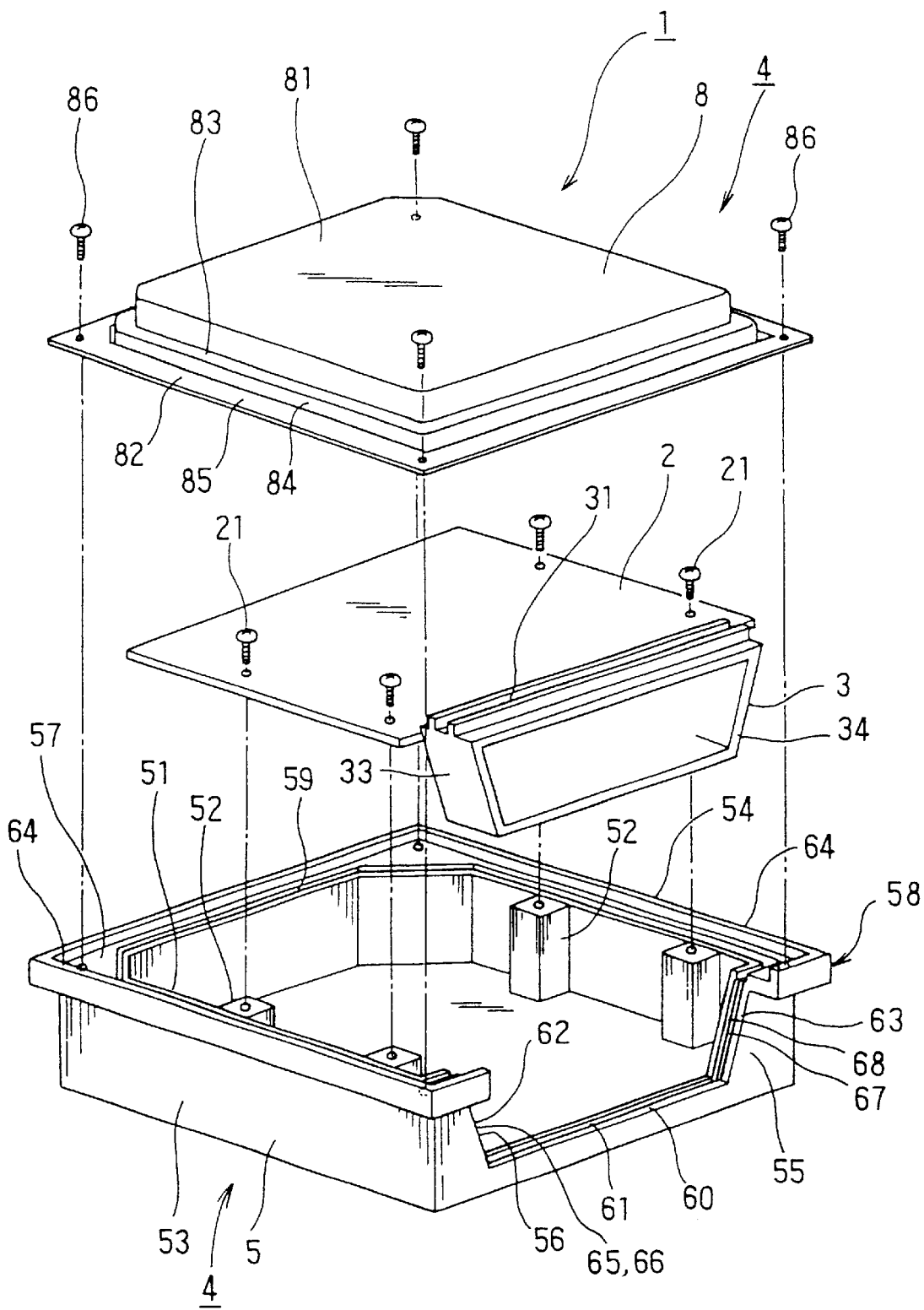
FIG. 7 is an exploded perspective view showing an ECU according to a second embodiment of the invention.
Figure 8:
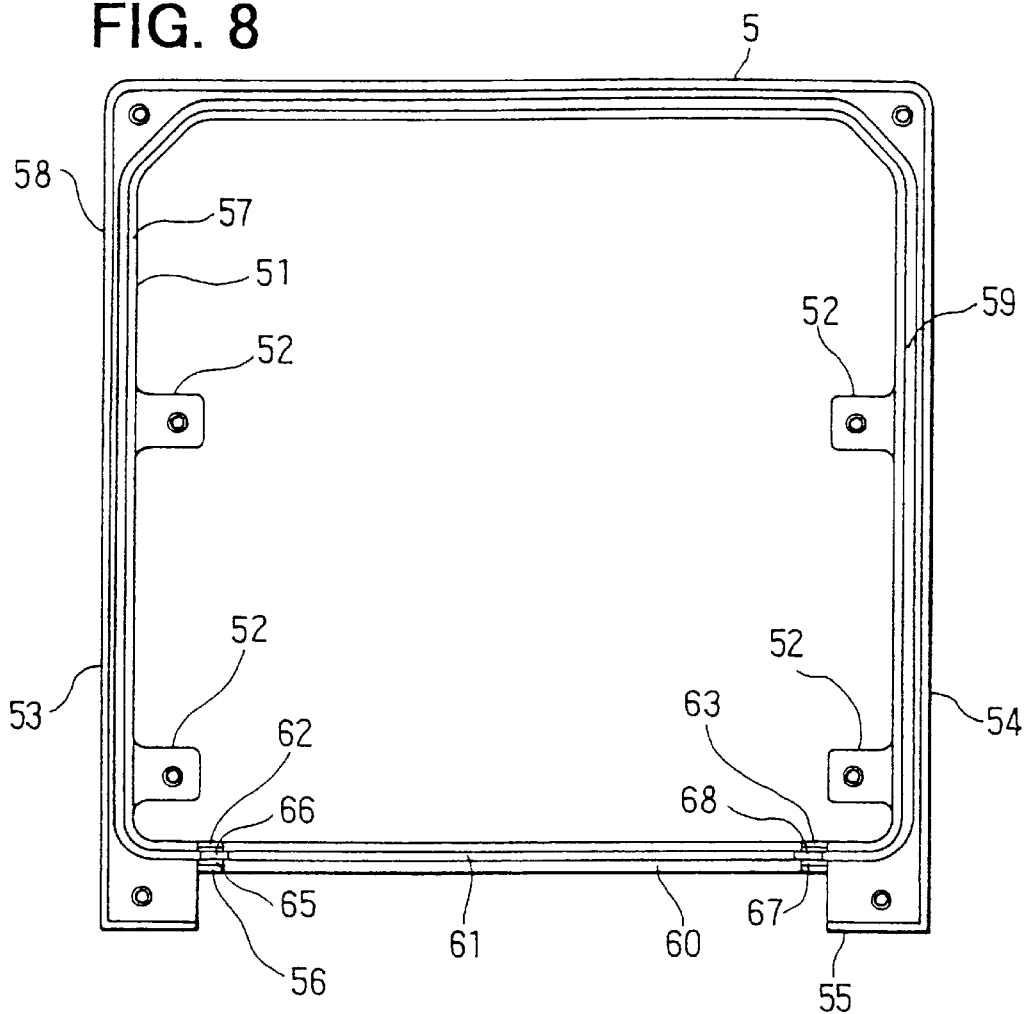
FIG. 8 is a top plan view of a casing body.
Figure 9:
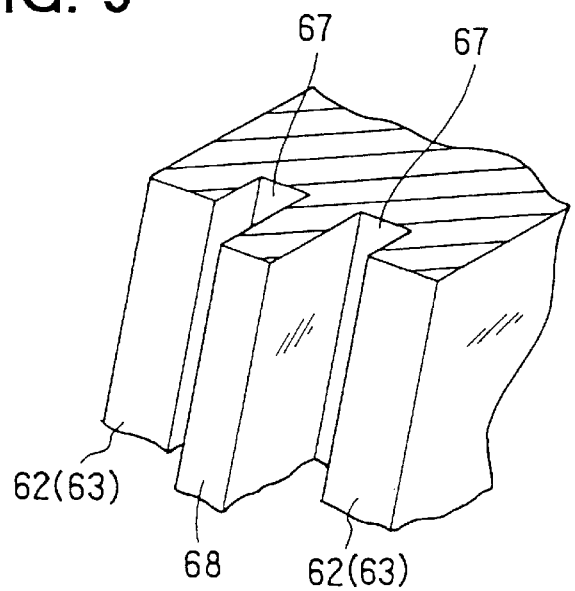
FIG. 9 is a partial perspective view showing an inner side face portion of a connector opening of the casing body.
Figure 10:
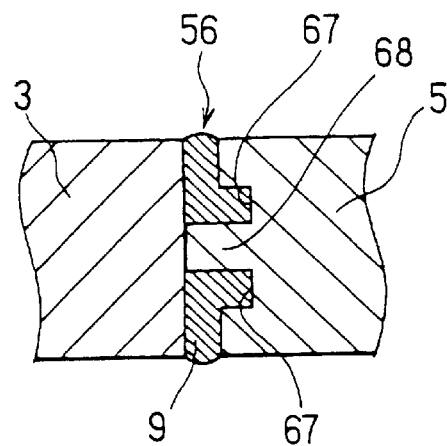
FIG. 10 is a transverse section showing the state in which an outer side face portion of a connector abuts against a ridge portion of the inner side face portion of the connector opening of the casing body.

Here will be described a second embodiment of the invention. In the inner side portions 62 and 63 on the two sides of the connector opening 56, there are formed groove portions 65 and 67, which extend from the upper end portions to the lower end portions of the inner side portions 62 and 63 and on which there are formed ridges 66 and 68. These ridges 66 and 68 are given a height of about 0.1 mm to 0.2 mm. The ridges 66 and 68 construct positioning portions of the invention. In the two sides of the ridges 66 and 68, moreover, there are formed the groove portions 65 and 67 for filling and holding the liquid sealing material 9, as shown in FIGS. 9 and 10. These groove portions 65 and 67 are omitted from FIGS. 7 and 8.

On the other hand, outer side portions 33 and 34 on the two sides of the connector are given flat faces. Moreover, these outer side portions 33 and 34 on the two sides of the connector 3 are formed to confront the inner side portions 62 and 63 on the two sides of the connector opening 56.

In the construction, when the connector 3 is assembled such that one of its outer side portions 33 and 34 comes close to one of the inner side portions 62 and 63 of the connector opening 56, one of the outer side portions 33 and 34 of the connector 3 abuts against one of the ridges 66 and 68 of the inner side portions 62 and 63 of the connector opening 56 (as referred to FIG. 10). As a result, a clearance of a predetermined distance (e.g., about 0.1 mm to 0.2 mm) is retained between one of the outer side portions 33 and 34 of the connector 14 and one of the inner side portions 62 and 63 of the connector opening 56, while leaving a larger clearance between the others.

As a result, the clearance of the predetermined distance (e.g., about 0.1 mm to 0.2 mm) can be retained between one of the outer side portions 33 and 34 of the connector 14 and one of the inner side portions 62 and 63 of the connector opening 56, while leaving a larger clearance between the others. Therefore, the clearance between the outer side portions 33 and 34 of the connector 3 and the inner side portions 62 and 63 of the connector opening 56 is charged with the liquid sealing material 9 without any interruption so that it can be reliably sealed up.

According to this embodiment thus constructed, the ridges (or the positioning portions) 66 and 68 are formed on the inner side portions 62 and 63 on the two sides of the connector opening 56 of the casing body 5 thereby to position the connector 3 transversely in the connector opening 56. As a result, the predetermined clearance can be reliably retained between the inner side portions 62 and 63 of the connector opening 56 and the outer side portions 33 and 34 of the connector 3.

Even in a low accuracy of the assembled position of the connector 3 on the side of the manufacture facilities (or the production line), therefore, the clearance can be reliably retained between the outer side portions 33 and 34 on the two sides of the connector 3 and the inner side portions 62 and 63 on the two sides of the connector opening 56. As a result, this clearance can be sufficiently sealed up by charging it with the liquid sealing material 9 without any interruption.

In the embodiment, the ridge 68 is so formed on the two inner side portions 62 and 63 on the two sides of the connector opening 56 as to extend from the upper ends to the lower ends thereof. However, the invention should not be limited thereto but may be modified such that the ridge 68 is made shorter or provided in plurality. Moreover, the ridge may be replaced by one projection or a plurality of projections.

In the embodiment, on the other hand, the ridge 68 (or the positioning portion) is formed on the two inner side portions 62 and 63 of the connector opening 56 of the casing body 5. Alternatively, the ridge 68 may be formed on the left and right outer side portions 33 and 34 of the connector 3. In this construction, the two inner side portions 62 and 63 of the connector opening 56 may be made flat. In this construction, on the other hand, the grooves may be formed in the two sides of the ridge, or this ridge may be made short or replaced by the projection.

Third Embodiment

Figure 11:
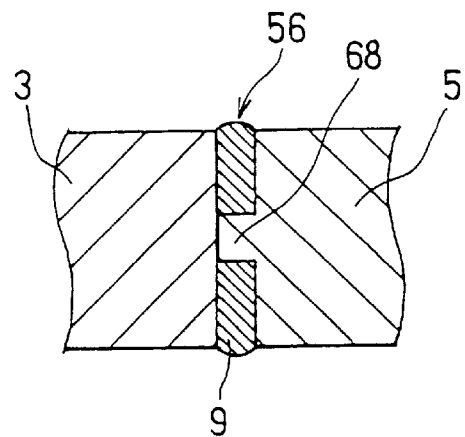
FIG. 11 is a transverse section showing a third embodiment of the invention.

FIG. 11 shows a third embodiment of the invention, which will be described on the portions different from those of the first embodiment. The same portions as those of the first embodiment will be designated by the common reference numerals. In this third embodiment, as shown in FIG. 11, the ridges 66 and 68 but not the groove portions 65 and 67 are formed on the two inner side portions of the connector opening 56 of the casing body 5. In this construction, too, the clearance of the predetermined distance can be retained between the outer side portions 33 and 34 of the connector 3 and the inner side portions 62 and 63 of the connector opening 56, so that it can be charged with the liquid sealing material 9.

Fourth Embodiment

Figure 12:
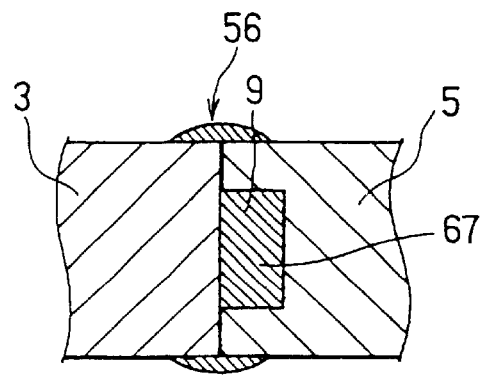
FIG. 12 is a transverse section showing a fourth embodiment of the invention.
Figure 13:
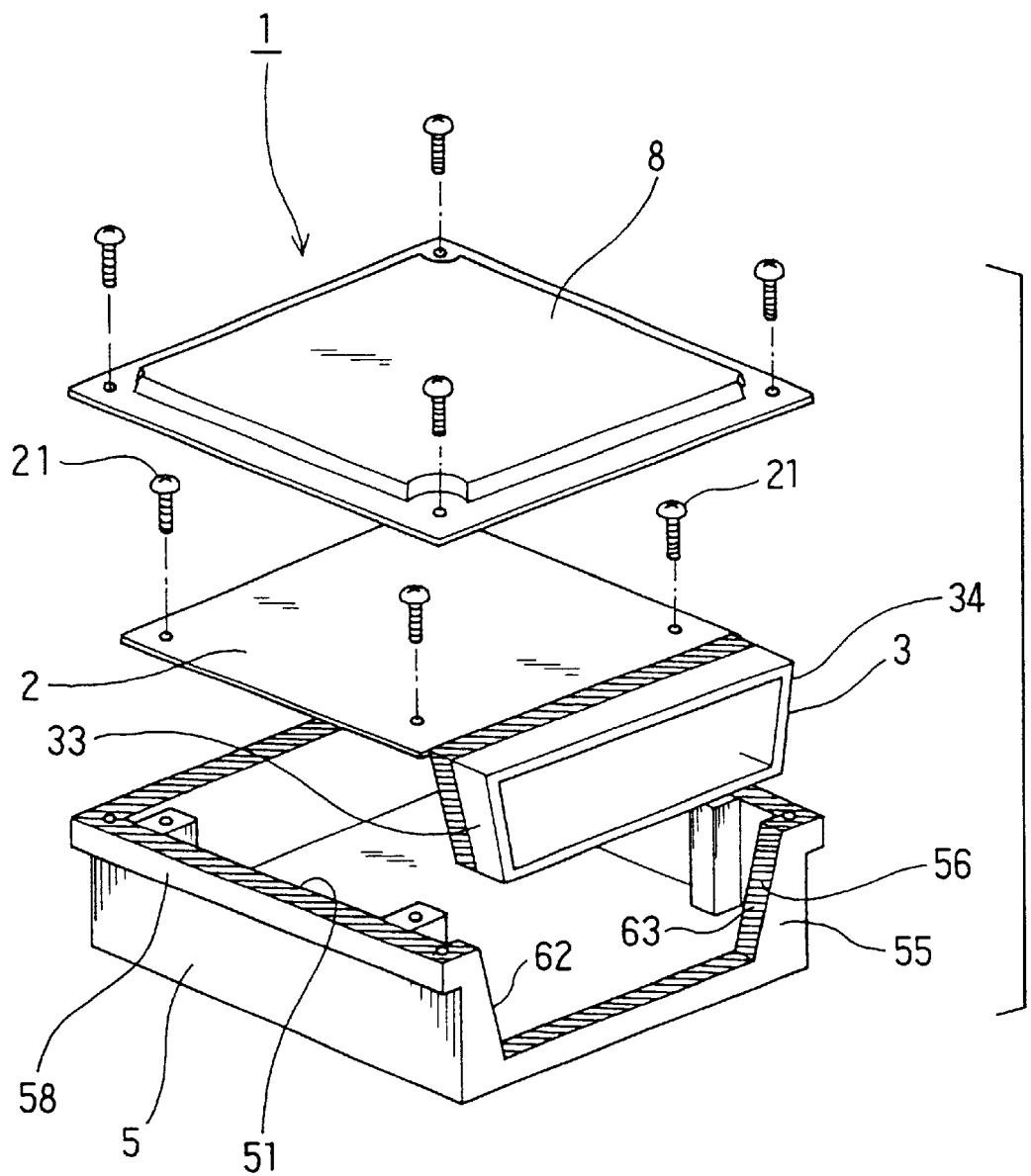
FIG. 13 is an exploded perspective view showing a construction of the prior art.
Figure 14:
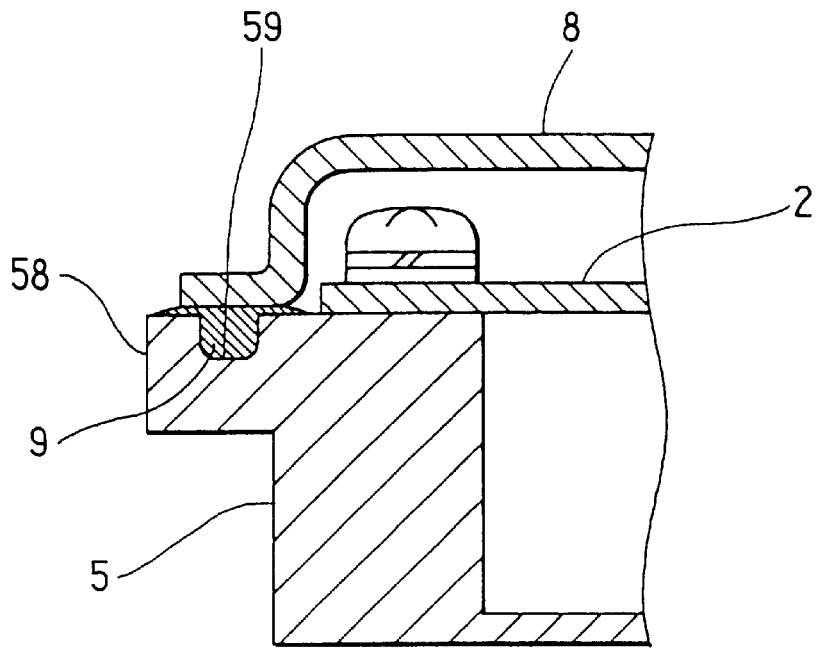
FIG. 14 is a longitudinal section showing a construction of the prior art.
Figure 15:
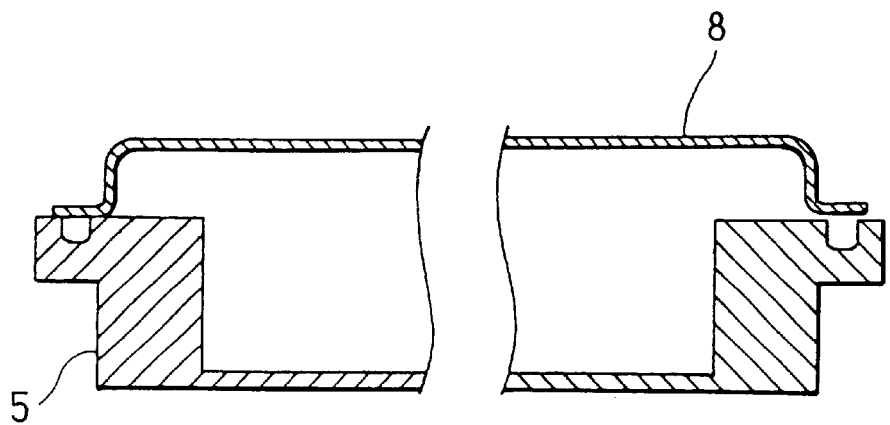
FIG. 15 is a longitudinal section showing a casing body and a cover.
Figure 16:
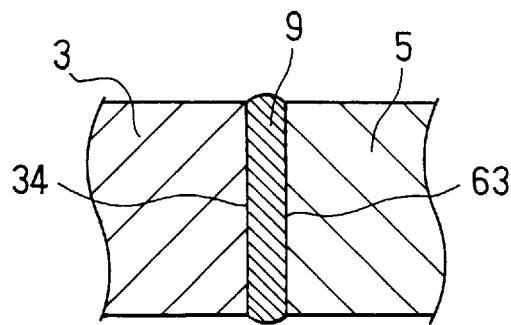
FIG. 16 is a transverse section showing the state in which a connector is assembled at a normal position.
Figure 17:
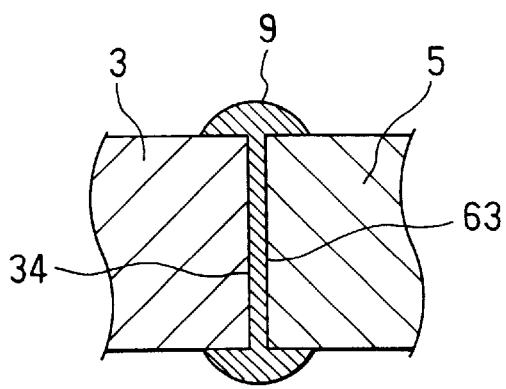
FIG. 17 is a transverse section showing the state in which the connector is assembled with a small shift from the normal position.
Figure 18:
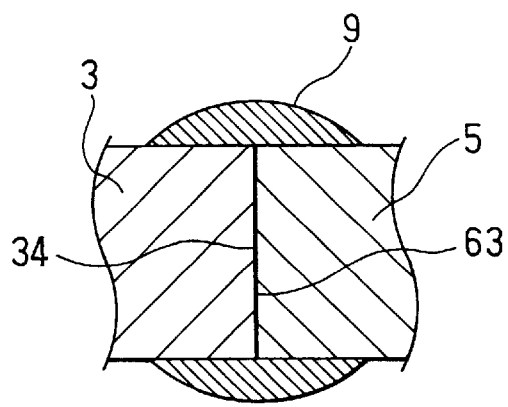
FIG. 18 is a transverse section showing the state in which the connector is assembled with a considerable shift from the normal position.

FIG. 12 shows a fourth embodiment of the invention, which will be described on the portions different from those of the first embodiment. The same portions as those of the first embodiment will be designated by the common reference numerals. In this third embodiment, as shown in FIG. 12, the groove portions 65 and 67 are formed in the inner side portions 62 and 63 on the two sides of the connector opening 56 of the casing body 5 thereby to leave portions corresponding to the ridges on the two sides.

In this construction, a clearance of a predetermined distance can be reliably retained between the outer side portions 33 and 34 of the connector 3 and the inner side portions 62 and 63 of the connector opening 56 so that it is charged with the liquid sealing material 9.

On the other hand, the constructions of the fourth embodiment other the aforementioned one are similar to those of the first embodiment. Therefore, the fourth embodiment can attain substantially the same effects as those of the first embodiment.

Here, the ridge portion 84 may have a generally V-shaped section or a W-shaped section, instead of the U-shaped section.

What is claimed is:

1. A casing for an electronic control device, comprising:
   a casing body for casing an electronic control unit, and having an open edge portion defining an opening, the open edge portion including a groove portion, the casing body including a wall portion formed to rise from the open edge portion on an outer side of the groove portion;
   a cover for closing the opening of the casing body, the cover having a peripheral edge portion; and
   a liquid sealing material filled in the groove portion for sealing the open edge portion of the casing body and the peripheral edge portion of the cover, wherein the wall portion of the casing body is located on an outside of the peripheral edge portion of the cover and includes an upper edge portion that rises higher than an upper edge of the groove portion.

2. The casing according to claim 1, wherein the cover is made of a metal sheet.

3. The casing according to claim 2, wherein the cover is made of a steel sheet.

4. The casing according to claim 3, wherein the cover is press formed.

5. The casing according to claim 1, further comprising a horizontal portion the peripheral edge portion of the cover and extending outside of the ridge portion.

6. The casing according to claim 2, wherein the cover is press formed.

7. The casing according to claim 5, wherein the upper edge portion of the wall portion is located higher than an upper surface of the horizontal portion.

8. The casing according to claim 5, wherein the open edge portion of the casing body further includes a supporting surface for supporting the horizontal portion of the cover, the supporting surface is formed just outside the groove, and wherein the wall portion perpendicularly rises from the supporting surface.

9. The casing according to claim 5, wherein a part of the liquid sealing material exists between the horizontal portion of the cover and the supporting surface of the casing body, and between an outer periphery of the cover and the wall portion of the casing body.

10. The casing according to claim 5, wherein a part of the liquid sealing material is deformed by the wall portion and is stuck on an upper surface of the horizontal portion of the cover.

11. The casing according to claim 9, wherein a part of the liquid sealing material protrudes above the horizontal portion of the cover from a gap between the outer periphery of the cover and the wall portion of the casing body.

12. The casing according to claim 11, wherein a part of the liquid sealing material is stuck on an upper surface of the horizontal portion of the cover.

13. The casing according to claim 1, wherein the cover includes a ridged portion having a bent portion formed on the peripheral edge portion so as to be fitted in the groove portion of the casing body.

14. The casing according to claim 13, wherein the ridge portion has a U-shaped section.

15. The casing according to claim 13, wherein the ridge portion is press formed.

* * * * *